United States Patent
Pavloski et al.

[11] Patent Number: 5,844,683
[45] Date of Patent: Dec. 1, 1998

[54] POSITION SENSOR SYSTEM FOR SUBSTRATE HOLDERS

[75] Inventors: Andrew Pavloski, Sunnyvale; Dmitry Sklyar, San Jose; Andrej Rolny, Fremont, all of Calif.

[73] Assignee: Applied Materials, Inc., Santa Clara, Calif.

[21] Appl. No.: 651,227

[22] Filed: May 22, 1996

[51] Int. Cl.⁶ .................................................. G01B 11/00
[52] U.S. Cl. ............................................ 356/399; 356/400
[58] Field of Search .................................. 356/399, 246, 356/244, 400, 401; 38/560, 568.16, 568.12, 568.19, 687; 235/381, 375

[56] References Cited

U.S. PATENT DOCUMENTS

| | | | |
|---|---|---|---|
| 4,657,620 | 4/1987 | Davis et al. | 156/345 |
| 4,776,744 | 10/1988 | Stonestreet et al. | 414/217 |
| 5,442,163 | 8/1995 | Nakahara et al. | 235/381 |
| 5,483,138 | 1/1996 | Shmookler et al. | 318/568 |
| 5,563,798 | 10/1996 | Berken et al. | 364/478 |

Primary Examiner—Frank G. Font
Assistant Examiner—Michael P. Stafira
Attorney, Agent, or Firm—Ashok K. Janah; Raymond K. Kwong

[57] ABSTRACT

The position sensor (20) and method of the present invention allows detecting proper placement of substrate holders (25) in a processing apparatus (35), and can also be used to detect displacement of the substrates (70) within the substrate holder (25). The position sensor (20) comprises (a) an optical emitter (120) capable of emitting a light beam, (b) an optical sensor (125) capable of sensing the light beam emitted by the optical emitter (120), and (c) a light regulator (130) in a path (135) of the light beam that is capable of blocking the light beam from the optical sensor when the substrate holder (25) is improperly positioned in the process chamber (40).

36 Claims, 7 Drawing Sheets

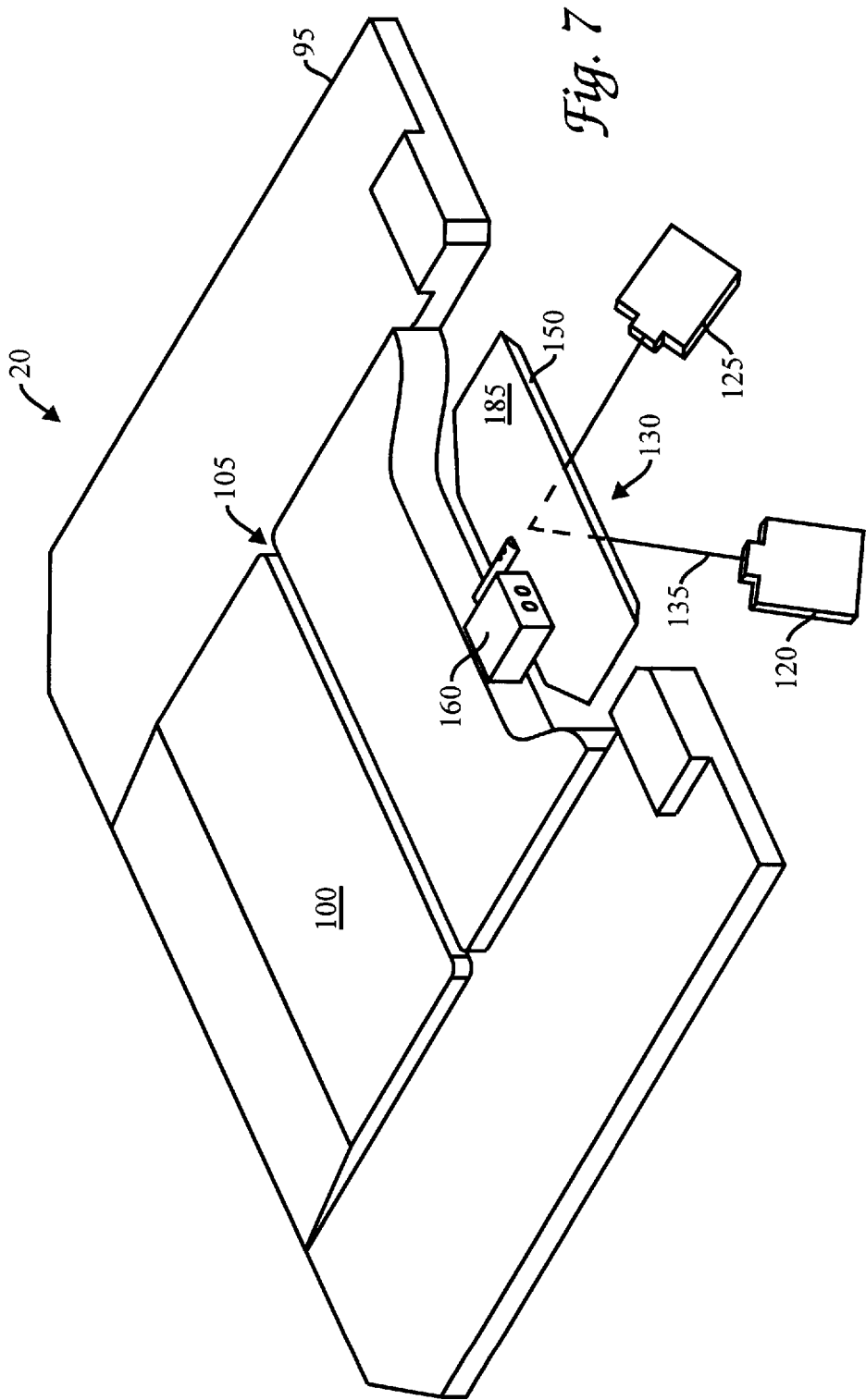

POSITION SENSOR SYSTEM FOR SUBSTRATE HOLDERS

BACKGROUND

The present invention relates to a system for detecting proper positioning of a substrate holder in a process chamber, and for detecting displacement of substrates within the substrate holder.

In the semiconductor industry, silicon wafers substrates are batch processed using sequential processing steps. The different process steps are performed in single or multi-chamber processing apparatus. During such processing steps, the substrates are typically held in substrate holders (commonly known as "cassette handlers"), that hold a stack of substrates for batch-type processing of the substrates in process chambers, and for facilitating transfer of the substrates from one processing apparatus to another. A typical substrate holder comprises a frame having a plurality of slots sized to hold substrates, as shown in FIG. 3. An operator, or an external loading robot, transports the substrate holder from one processing apparatus to another.

One problem that occurs during transportation and placement of the substrate holder in the processing apparatus relates to proper positioning of the substrate holder in the apparatus. The processing apparatus typically comprises multiple process chambers interconnected to an central transfer chamber which connects to an evacuated loading chamber, commonly known as a load-lock. The loading chamber contains a loading platform upon which the substrate holder is positioned by the operator or the external loading robot. During processing, an internal robotic arm operating in the transfer chamber extends a blade into the loading chamber, lifts a substrate from the substrate holder, and transfers the substrate to a process chamber. However, improper positioning of the substrate holder on the loading platform can cause the robotic arm to strike the holder or a substrate, resulting in misalignment and damage to the precision mechanism of the robotic arm, or loss of the substrate. Also, motion of the substrate holder during transportation between different processing apparatus can cause substrates to extend out of the slots of the substrate holder, causing the robotic arm to malfunction or drop the substrate during operation.

In a partial solution to this problem, the loading platform has a receiving surface designed to receive the substrate holder to ensure proper placement and alignment of the substrate holder. Typically, the receiving surface of the loading platform includes a channel sized to receive a corresponding alignment guide on a bottom surface of the substrate holder, so that the substrate holder locks or snaps into place on the loading platform. However, this design does not always ensure proper placement of the substrate holder because it is difficult for an operator to determine if the alignment guide is properly fitted into the channel. Also, the force required to properly snap the alignment guide into the channel can cause movement or displacement of the substrates in the holder.

Proper alignment of the substrate holder is particularly difficult when external loading robots are used to load the substrate holder into the loading chamber. External loading robots are used in state-of-the-art automated batch processing systems to transport the substrate holder from one processing apparatus to another. In such systems, the external robot often fails to properly position the substrate holder in the loading chamber, and it is difficult to design a robot to detect or correct such improper positioning. Also, the substrate often move during transportation and extend out of the substrate holder causing further problems.

Thus, there is a need for a system for detecting proper placement and positioning of substrate holders on a loading platform of a processing apparatus. It is also desirable to detect displacement of the substrates within the substrate holder prior to operation of the process chamber, to reduce damage to processing components, such as robotic arms, and to reduce the incidence of damaged or dropped substrates.

SUMMARY

The position sensor of the present invention allows detecting proper placement of substrate holders in a processing apparatus, and can also be used to detect displacement of the substrates within the substrate holder. The position sensor comprises (a) an optical emitter capable of emitting a light beam, (b) an optical sensor capable of sensing the light beam emitted by the optical emitter, and (c) a movable light regulator in a path of the light beam that is capable of blocking the light beam from the optical sensor when the substrate holder is improperly positioned in the process chamber.

In a preferred embodiment, the light regulator comprises a movable member having (i) a blocking position that blocks the light beam from the optical sensor when the substrate holder is improperly positioned in the process chamber, and (ii) an transmitting position that allows the light beam to reach the optical sensor when the substrate holder is properly positioned in the process chamber. The movable member can comprise an aperture which, in the blocking position, is substantially nonaligned with the light beam, and in the transmitting position is aligned with the light beam allowing the light beam to reach the optical sensor. In another version, the movable member comprises a reflector, that in the blocking position reflects the light beam away from the optical sensor, and in the transmitting position reflects the light beam toward the optical sensor.

In another aspect, the present invention comprises a method for using an optical system to detect proper placement of a substrate holder on a receiving surface in a process chamber. The method comprises the steps of (i) placing the substrate holder on a receiving surface of a loading chamber, (ii) sensing proper placement of the substrate holder on the receiving surface using the optical system, and (iii) indicating proper placement of the substrate holder using an indicator responsive to the optical system.

In yet another aspect of the present invention, a substrate displacement sensor is used to detect displacement of a substrate held by the substrate holder. In this version, the optical emitter is mounted in the loading chamber to direct the light beam in a path adjacent to the peripheral edges of the substrates. The optical sensor is mounted in the path of the light beam so that displacement of a substrate in the substrate holder by a predetermined distance out of the substrate holder causes a peripheral edge of the substrate to block the light beam from the optical sensor. A placement indicator responsive to the optical sensor is used to indicate displacement of a substrate in the substrate holder.

DRAWINGS

These and other features, aspects, and advantages of the present invention will be better understood from the following drawings, description and appended claims, which illustrate examples of the invention, where:

FIG. 7 is a schematic perspective view of a loading platform showing another embodiment of the position sensor comprising a light regulator having a movable member with a reflector in a reflecting position.

DESCRIPTION

Figure 1:
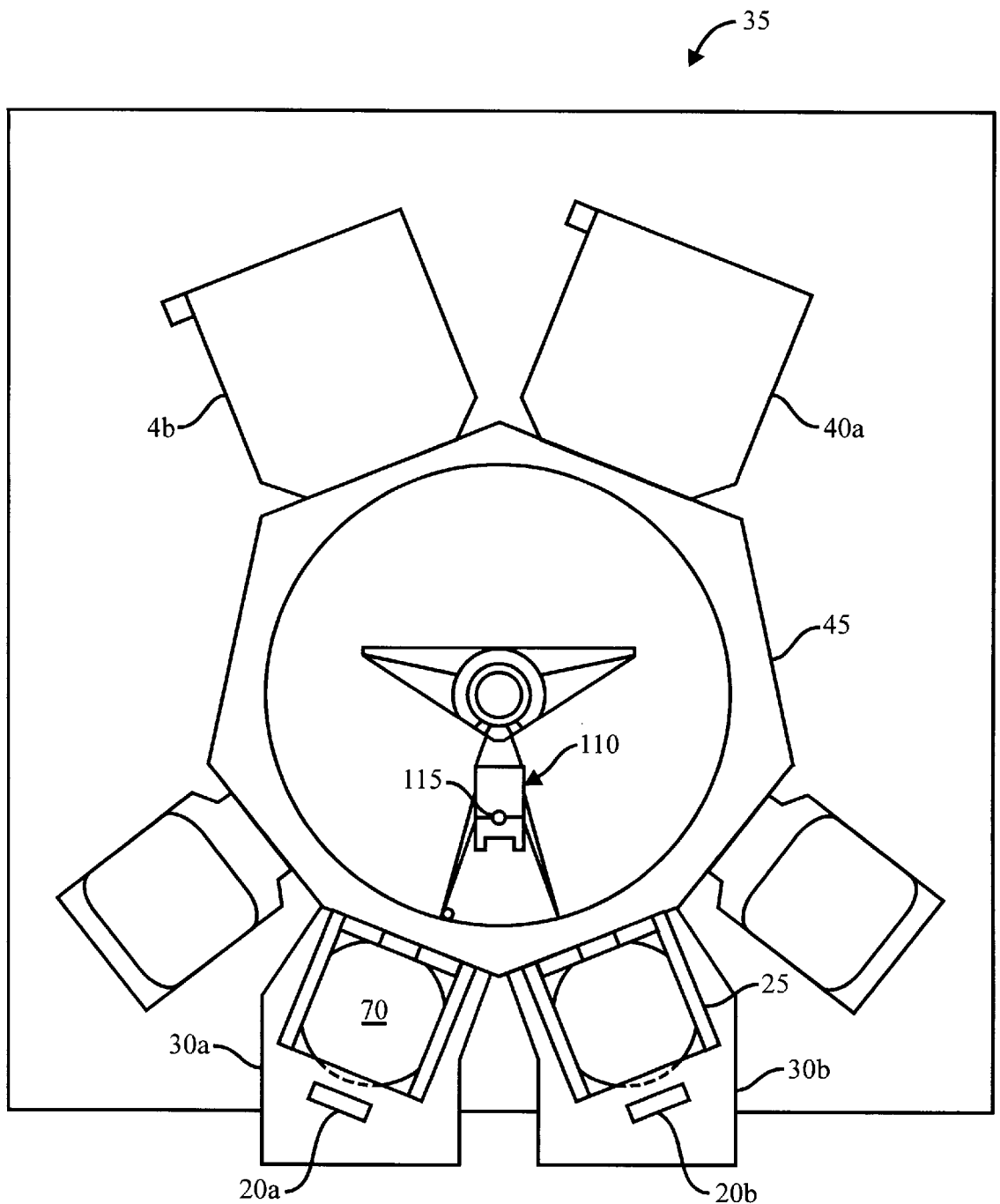
FIG. 1 is a schematic sectional top view of a processing apparatus used for processing substrates.
Figure 2:
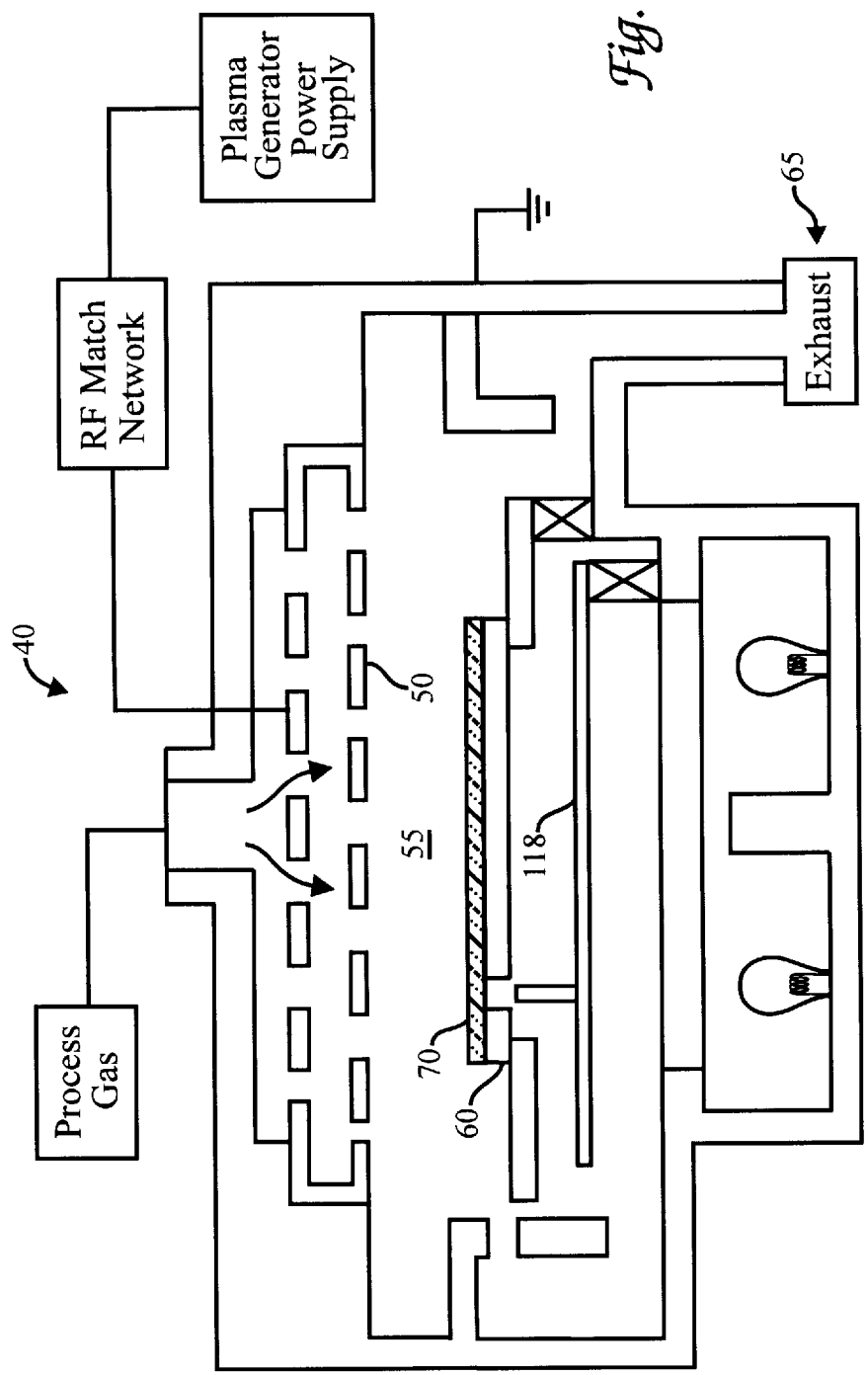
FIG. 2 is a schematic partial sectional view of a process chamber of the apparatus of FIG. 1.

The position sensor 20 of the present invention is useful for detecting proper placement of a substrate holder 25 in a loading chamber 30 of a substrate processing apparatus 35. With reference to FIG. 1, the processing apparatus 35 comprises a cluster of process chambers 40a, 40b, for example, etching, implanting, and deposition process chambers surrounding a transfer chamber 45 that is interconnected to the loading chambers 30a, 30b. Suitable apparatus 35 include for example, Centura 5200, MxP+, or Precision 5000 apparatus, commercially available from Applied Materials, Santa Clara, Calif. As shown in FIG. 2, a process chamber 40 of the apparatus 35 includes a gas distributor 50, mass flow controllers, and air operated valves, for distributing the process gas into a process zone 55 of the process chamber. A support 60 is used to support a substrate 70 in the process zone 55. An electric field can be applied in the process zone 55 to form a plasma from the process gas (i) inductively by applying an RF current to an inductor coil (not shown) encircling the process chamber 40, (ii) capacitively by applying an RF current to cathode and anode electrodes in the process chamber (as shown), and/or (iii) using a microwave generator (not shown). Spent process gas and etchant byproducts are exhausted from the process chamber 40 through an exhaust system 65 capable of achieving a minimum pressure of about $10^{-3}$ mTorr in the process chamber. The particular embodiment of the apparatus 35 shown herein, is suitable for processing of semiconductor substrates 70, is provided only to illustrate the invention, and should not be used to limit the scope of the invention. For example, the position sensor 20 of the present invention can be used for manufacturing equipment other than semiconductor fabrication equipment.

Figure 3:
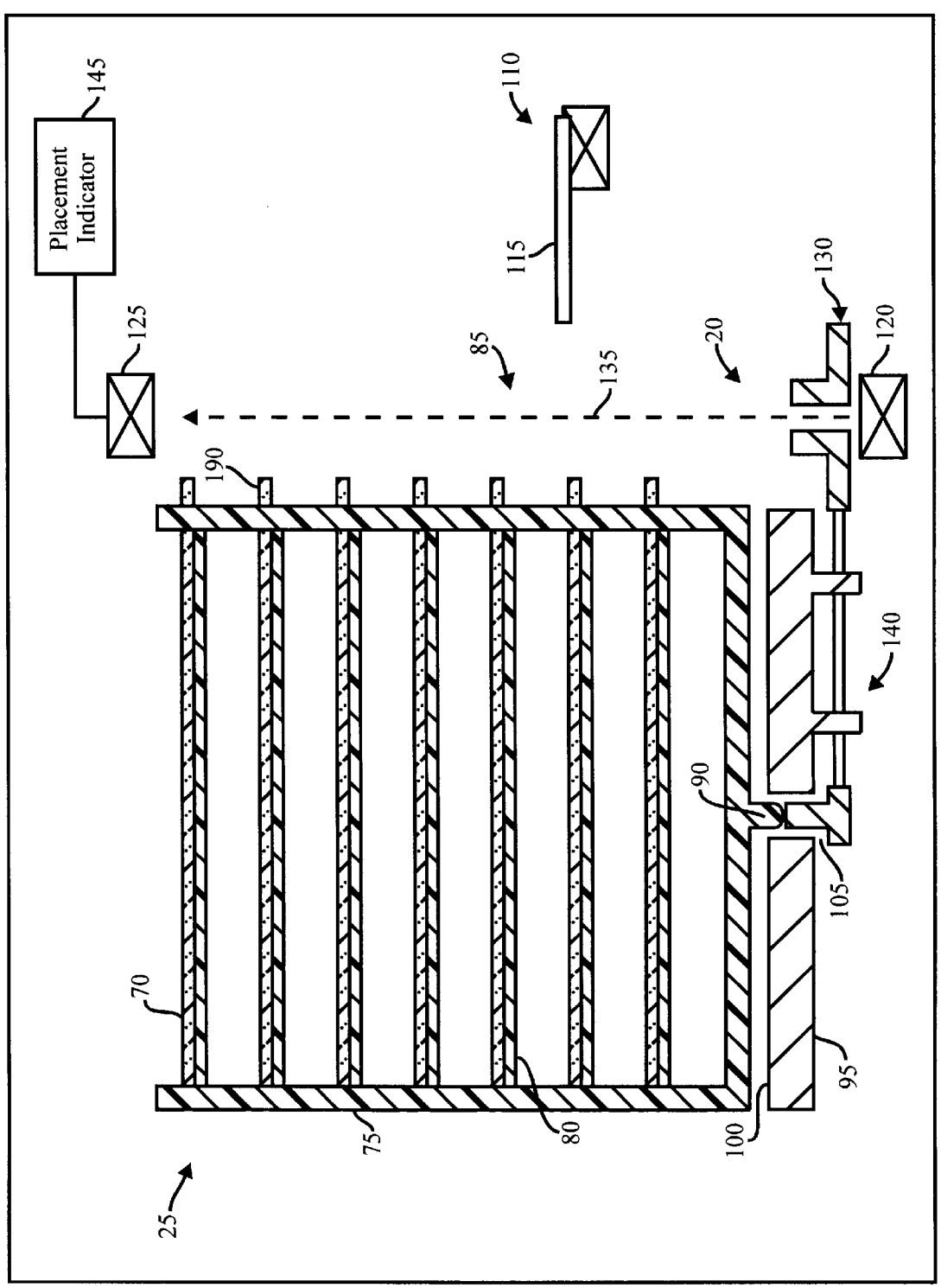
FIG. 3 is a schematic side view of a loading chamber of the apparatus of FIG. 1, showing the loading platform on which a substrate holder is positioned and the position sensor of the present invention.

The substrate holder 25 is used to hold substrates 70 such as glass, ceramic, metal, polymer, or semiconductor substrates, for example silicon or gallium arsenide wafers, in a stacked arrangement to facilitate batch processing of the substrates and to facilitate their transport between process steps. A typical substrate holder 25, as shown in the schematic of FIG. 3, comprises a frame 75 having a plurality of parallel slots 80 extending from a front opening 85 to the rear of the holder 20, the slots provided to hold substrates 70 in a stacked arrangement. The bottom surface of the substrate holder 25 preferably includes an alignment guide 90, such as an H-shaped ridge, useful for aligning the substrate holder in the loading chamber 30. A suitable substrate holder 25 is the "PA200-79MDTH" cassette holder manufactured by Flouroware.

With reference to FIG. 3, a substrate holder 25 loaded with substrates 70 is placed by an operator or an external robot on a loading platform 95 having a receiving surface 100 configured to receive, and preferably align, the substrate holder in the loading chamber 30. Preferably, the receiving surface 100 comprising a recessed channel 105 sized to hold at least a portion of an alignment guide 90 of the substrate holder 25, so that the substrate holder can be snapped onto the receiving surface 100. Typically, the loading chambers 30a, 30b are evacuated, or maintained at a positive pressure using inert gas, during processing of the substrates 70. A robotic arm 110 has a lifting blade 115 for lifting and carrying a single substrate 70 at a time, the substrates from the loading chamber 30 to the process chamber 40 via a loading inlet, as shown in FIG. 1. The substrate 70 is positioned on a lift finger assembly 118 in the process chamber 40, and thereafter lowered onto the support 60 by lowering the lift fingers 118. Typically, the robot arm 110 is driven by conventional dual co-axial magnetic couplers and motors, and is operated by a computer program implemented on a conventional computer system that is integrated with the processing apparatus 35.

The position sensor 20 of the present invention is used to detect proper placement of the substrate holder 25 on the loading platform 95 of the loading chamber 30. With reference to FIG. 3, the position sensor 20 includes (i) an optical emitter or source 120 capable of emitting a light beam, an optical sensor or detector 125 capable of sensing the light beam emitted by the optical emitter 120, and (iii) a movable light regulator 130 in a path 135 of the light beam, the light regulator having (i) a blocking position that blocks the light beam from the optical sensor when the substrate holder 25 is improperly positioned in the process chamber 40, and (ii) a transmitting, relaying, or reflecting position that allows or directs the light beam onto the optical sensor when the substrate holder 25 is properly positioned in the process chamber. An actuator 140 maintains or moves the light regulator 130 to the blocking position when the substrate holder 25 is improperly positioned in the process chamber 40, or to the transmitting position when the substrate holder is properly positioned. Optionally, a placement indicator 145 responsive to the optical sensor 125 can be used to indicate proper placement of the substrate holder 25.

The optical emitter 120 can be any conventional, compact light source, such as a Cutler-Hammer "Comet" commercially available from Cutler-Hammer, Inc., capable of providing a beam of light, such as visible, infra-red, or UV light. Although the present invention is described with reference to a light beam, it should be apparent that any directional beam of electromagnetic radiation, such as for example, a directional radio frequency or microwave beam is also suitable, and is encompassed with the scope of the present invention. Preferably, the optical emitter 120 emits a beam of visible light having a conical cross-section to provide an illumination area sufficiently large to cover at least a portion of a sensing element of the optical sensor 125.

The optical sensor 125 can be any conventional, compact, light sensor, such as, for example the aforementioned Cutler-Hammer "Comet" light sensors commercially available from Cutler-Hammer, Inc., that comprise a light sensing element capable of detecting a beam of light. Both the optical emitter 120 and the optical sensor 125 are typically powered by a conventional 24 volt DC power source (not shown).

The optical emitter 120 and optical sensor 125 can also be contained within a single housing with the optical emitter element facing in the same, or a different direction, as the optical sensing element. A suitable unitary optical emitter and optical sensor structure comprises a "CY-27" sensor, fabricated by SUNX Company, commercially available from Bay Pneumatic, Menlo Park, Calif.

As illustrated in FIG. 3, the light regulator 130 is positioned in the path 135 of the light beam, and can comprise any conventional mechanism capable of (i) blocking the light beam from the optical sensor 125 when the substrate holder 25 is improperly positioned in the process chamber 40, and (ii) transmitting the light beam onto the sensing element of the optical sensor 125 when the substrate holder is properly positioned. By "transmitting" it is meant that the light beam is transmitted, relayed, reflected or otherwise transported to the optical sensor 125.

Figure 4:
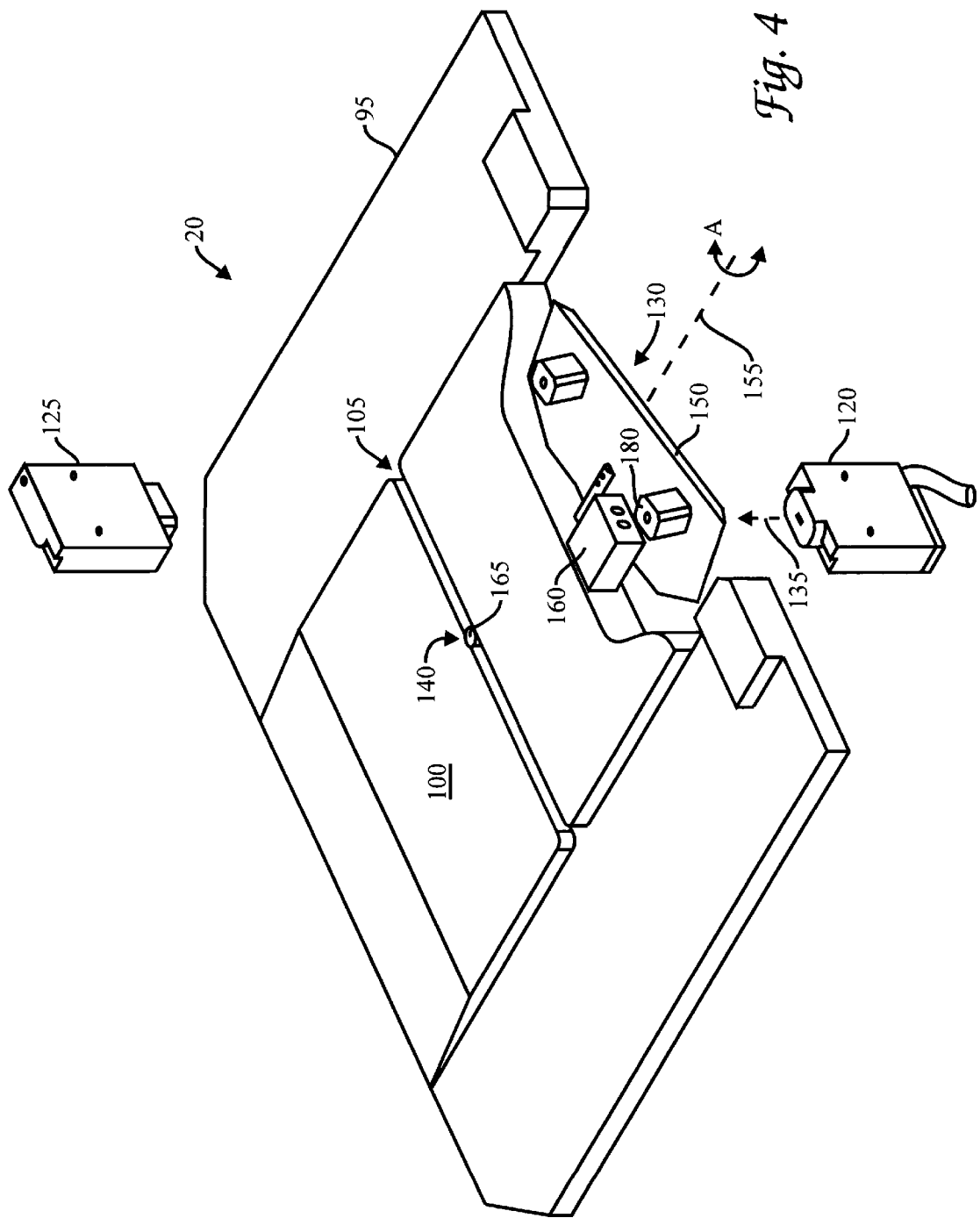
FIG. 4 is a schematic perspective view of a loading platform showing an embodiment of the position sensor comprising a light regulator having a movable member with an aperture, the aperture positioned in the non-aligned or blocking position.
Figure 5:
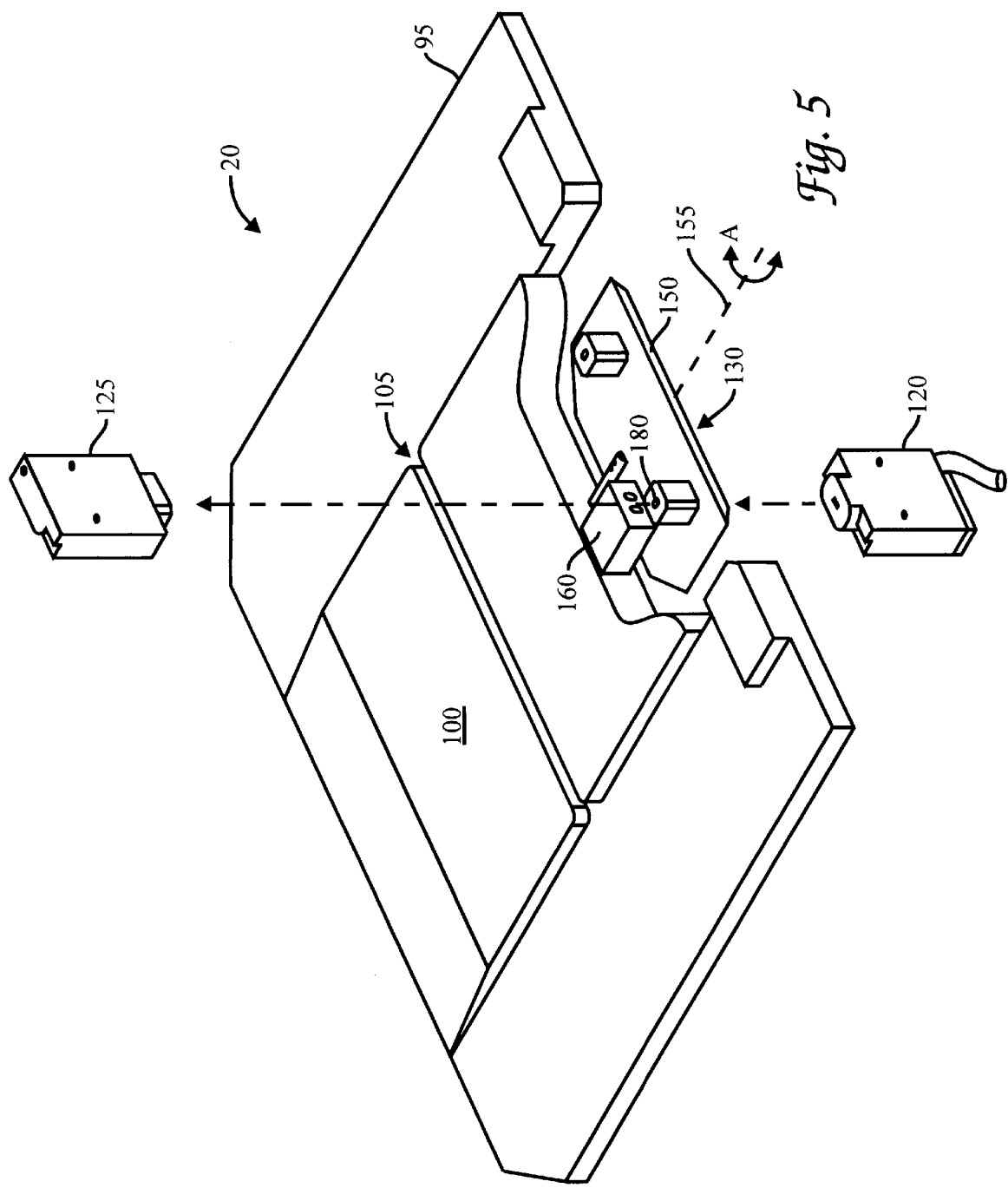
FIG. 5 is a schematic perspective view of the position sensor of FIG. 3 showing the aperture of the movable member in an aligned or transmitting position.
Figure 6:
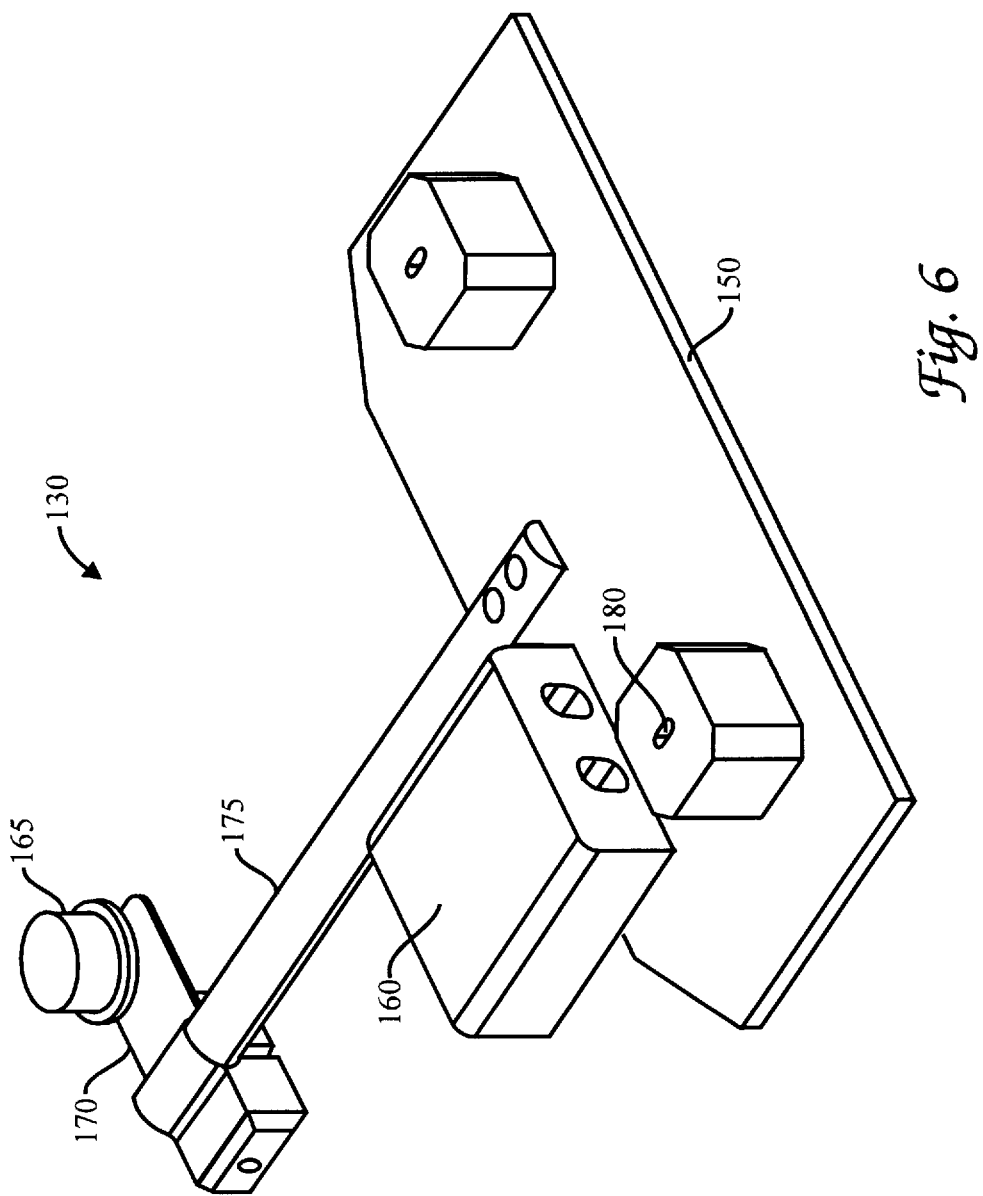
FIG. 6 is a schematic perspective view showing the detail of the movable member shown in FIG. 3.

In a preferred embodiment shown in FIGS. 4 to 6, the light regulator 130 comprises a movable member 150 capable of rotating from the blocking position to the transmitting position. The movable member 150 preferably comprises a plate made of stainless steel, aluminum, or any material having similar properties. Preferably, the movable member 150 is rotatably mounted on the platform 95 and has an axis of rotation 155 which is generally coplanar with the platform. The movable member 150 is rotable in a bidirectional manner, as indicated by arrow A in FIGS. 4 and 5. Preferably, the movable member 150 rotates bidirectionally in a limited range of movement of about 15 degrees, as measured between the blocking and transmitting position of the light regulator 130. A stop block 160 extending from the platform 95 can be used to limit the range of movement of the movable member 150. The stop block 160 comprises a block formed of a rigid polymer or metal, for example, nylon or aluminum, and is mounted substantially coplanar to the platform 95. As described below, when the movable member 150 is held against the stop block 160, the light regulator 130 is in the blocking position. A spring or counterweight can be used to bias the movable member 150 to maintain the movable member in the blocking position. For example, a spring can be mounted in the stop block 160 and attached to movable member 150 to bias and hold the member against the stop block. Alternatively, a counterweight can be mounted on the movable member 150 such that the movable member is held against the stop block 160.

The actuator 140 can comprise any mechanism capable of detecting proper placement of the substrate holder 25, and capable of actuating or moving the light regulator 130 from a blocking position when the substrate holder is improperly positioned in the process chamber 40, to the transmitting position when the substrate holder is properly positioned. With reference to FIG. 6, a preferred version of the actuator 140 comprises a retractable member, such as a pin 165 mounted on a ledge 170, the ledge being attached to one end of a shaft 175, such as a cylindrical pole made of steel or aluminum, or other suitably strong, rigid materials. The other end of the shaft 175 is attached to the movable member 150 of the light regulator 130, by screws or other suitable fastening means. The shaft 175 is rotably mounted in a longitudinal hole in the platform 95, or rotably coupled to the loading platform using U-shaped couplers or conventional coupler/bearing assemblies (not shown). Preferably, the actuator 140 is mounted on the platform 95 so that the activator is located in the alignment channel 105 on the loading chamber platform, as shown in FIG. 3. The actuator 140 is capable of rotating the movable member 150 from the blocking position to the transmitting position when the substrate holder 25 is properly positioned on the receiving surface 100.

In the version illustrated in FIGS. 4 to 6, the movable member 150 of the light regulator 130 comprises an aperture 180 cut or drilled through the planar surface of the movable member. Preferably, the aperture 180 has a generally round shape with a diameter of approximately 0.1 to 5 mm. An aperture 180 having a longitudinal axis can also be formed in a post to provide a more directional aperture. In this embodiment, the optical emitter 120 and optical sensor 125 are mounted on opposing sides of the movable member 150. For example, the optical emitter 120 can be mounted in a lower portion of the loading chamber 30, and below the movable member 150, to direct the light beam toward a lower surface of the movable member; and the optical sensor 125 can be mounted in an upper portion of the loading chamber above the movable member, with the sensing element of the optical sensor directed toward the optical emitter 120. In this arrangement, the movable member 150 is mounted to intersect the path 135 of the light beam. Although a preferred arrangement of the optical emitter 120, optical sensor 125, and light regulator 130 is described, it should be recognized that alternative configurations for the optical emitter and optical sensor would be apparent to one of ordinary skill; thus, the present invention should not be limited to the emitter, sensor, and light regulator arrangements provided as examples to illustrate the present invention.

The position sensor 20 can further include a placement indicator 145 which is responsive to the optical sensor 125. The placement indicator 145 operates in an on-mode and an off-mode. The placement indicator 145 is in the on-mode when the light beam is incident on the sensing element of the optical sensor 125, and is in the off-mode when the light beam is directed away optical sensor. A suitable placement indicator 145 comprises a light emitting diode activated by a voltage from the optical sensor 125. Conventional circuitry is used to connect the placement indicator 145 to the optical sensor 125.

A computer program comprising a computer usable medium having computer readable program code embodied therein can be used to operate the position sensor 20, robotic arm 110, and process chamber 40. The computer program can run on a conventional computer system comprising a central processor unit (CPU), such as for example a 68040 microprocessor, commercially available from Synenergy Microsystems, California, interconnected to a memory system with peripheral controller components. The code of the computer program can be written in any conventional computer language such as for example 68000 native language, C, C++, or pascal, that can accept data input and send electrical signals for operating the components of the apparatus 35. Suitable code is entered into a single file, or multiple files, using a conventional text editor, and stored in a memory of the computer system, such as a hard drive or floppy disc. The code text, when written in a higher level language, such as C, C++ or pascal, is compiled using a language compiler. The compiler code is then linked with an object code of precompiled windows library routines. To execute the compiled object code, the user invokes the object code, causing the computer system to load the code in memory, and the CPU of the computer system reads and executes the code to perform the tasks identified in the program.

Typically, the computer program comprises (i) program code for activating the optical emitter 120 to emit a beam of light, (ii) program code for activating the optical sensor 125 to determine if the light beam is incident on the optical sensor, and (iii) program code for activating the placement indicator 145, such as an LED light, to indicate proper placement of the substrate holder 25 in response to a determination that the light beam is incident on the optical sensor. Preferably, the program code allows the placement indicator 145 to remain activated as long as the optical sensor 125 determines that the light beam is incident on the optical sensor. Program code for deactivating the placement indicator 145 if a substrate 70 held in the substrate holder 25 is displaced a predetermined distance out of the substrate holder, can also be used.

The zero level signal generated by the optical sensor 125 when the light beam is not incident on the sensor (indicating improper placement of the substrate holder 25), can also be used as a control signal that activates the computer program to maintain the apparatus 35 in a non-operational mode until the substrate detector is properly positioned in the loading chamber 30. This safety feature prevents accidental operation of the apparatus 35 when the substrate holder 25 is not properly positioned on the loading chamber platform 95. The same signal can be used to maintain the processing apparatus 35 in a non-operational mode when a substrate 70 is displaced from the substrate holder 25.

Another version of the position sensor 20 of the present invention will now be described with reference to FIG. 7. In this version, the movable member 150 includes a reflector 185 which reflects the beam of light emitted by the optical source 26 onto the sensing element of the optical sensor 125 when the substrate holder 25 is properly placed in the loading chamber 30. The reflector 185 can be a reflective coating such as a coating of aluminum adhered to the planar surface of the movable member 150. Alternatively, the reflector 185 can be constructed as a separate reflective member attached to the movable member 150 by conventional methods. In one version, the reflector 185 is on a lower surface of the movable member 150, and the optical emitter 120 and the optical sensor 125 are also both positioned below the movable member, as shown in FIG. 7. The optical emitter 120 and the optical sensor 125 are positioned in the loading chamber 30, typically with the axis of the optical emitter directed at an acute angle to the axis of the optical sensor, so that the movable member 150 in the transmitting position reflects the light beam onto the optical sensor. The optical emitter 120 and optical sensor 125 can comprise separate structures that are mounted at acute angles to one another, or can comprise a unitary structure having the optical emitter 120 and optical sensor 125 mounted at an acute angle to each other within the unitary structure.

Operation of the position sensor 20 will now be described. When the process chamber 40 is in use, the optical emitter 120 is activated to emit a beam of light directed toward the movable member 150. Typically, an operator of the process chamber 40 places a substrate holder 25 on the loading platform 95. The substrate holder 25 is positioned so that the alignment guide 90 on the bottom of the substrate holder falls into the groove 42 on the platform 95. Proper placement of the alignment guide 90 causes the guide to press down on the pin 165 of the actuator 140. The pressure exerted by the alignment guide 90 triggers the actuator 140 forcing the shaft 175 and attached movable member 150 to rotate to the transmitting position, thereby directing the light beam to the optical sensor 125. The placement indicator 145 responds to the detection of the beam of light by turning on to indicate to the operator that the substrate holder 25 is properly placed in the loading chamber 30. As long as the placement indicator 145 remains on, the operator is assured that the substrate holder 25 is properly held in the loading chamber 30.

Another aspect of the invention is directed to detecting the movement or misalignment of substrates 70 in the substrate holder 25. During transferring of the substrates 70 from the substrate holder 25 to the process chamber 40, or during transferring of the substrate holder 25 in and out of the process loading chamber 30, the substrates can become displaced in the substrate holder. A small amount of displacement is often unavoidable, and can be tolerated without damaging the robot arm 110, or causing the substrates 70 to fall when picked-up by the robot arm. However, excessive displacement of the substrates 70 in the holder can damage the robot arm 110 and cause substrate breakage. Thus, preferably, the position sensor 20 is configured to detect displacement of a substrate 70 beyond tolerable levels, to operate as a substrate displacement sensor.

In this version, the optical emitter 120 is mounted in the loading chamber 30 to direct the light in a path 135 that is immediately adjacent to a peripheral edge 190 of the substrates 70 in the substrate holder 25. Preferably, the light beam path 135 is substantially perpendicular to the peripheral edge 190 of the substrates 70 so that the light beam is directed close to all the substrates 70. The optical sensor 125 is mounted in the path 135 of the light beam so that displacement of a substrate 70 in the substrate holder 25 a predetermined distance out of the substrate holder, causes a peripheral edge 190 of the substrate to block the light beam from the optical sensor. Preferably, the optical emitter 120 and the optical sensor 125 are mounted facing one another, the distance between the emitter and sensor being at least about the height of the stack of substrates 70 in the substrate holder 25 so that the light beam traverses close to the edges 190 of all the substrates 70.

The gap between the light beam path 135 and the substrate edges 190 is set to the amount of displacement that can be tolerated for the substrates 70. It is believed that the substrate 70 can be displaced up to about 0.25 inches before such displacement adversely affects the robotic transport of the substrates 70. Consequently, the light beam is preferably directed about 0.25 inches distant from the peripheral edge 190 of the substrates 70. Displacement of any of the substrates 70 by a distance of at least 0.25 inches out of the substrate holder 25, causes the peripheral edge 190 of the displaced substrate to block the beam of light, thereby preventing the optical sensor 125 from sensing the light beam.

A second placement indicator, or the same placement indicator 145 as described above, is responsive to the optical sensor 125, and is used to indicating displacement of a substrate 70 in the substrate holder 25. When the optical sensor 125 does not detect the light beam, or detect a partial intensity light beam, the placement indicator 145 turns off indicating to the operator that the substrates 70 are misaligned, and preventing operation of the apparatus 35. This construction of the position sensor 20 performs a two-fold function by detecting both improper placement of the substrate holder 25, and misalignment or movement of the substrates 70 held in the holder 25.

The present invention provides significant advantages in the field of semiconductor processing and the manufacture of processing apparatus. The position sensor 20 provides an indication that a substrate holder 25 has been properly positioned on the loading platform 95, and optionally prevents operation of the processing apparatus until the substrate holder is properly positioned. Another advantage of the present invention, is that the position sensor 20 can also detect and provide an indication if a substrate 70 is displaced within the holder 25. These advantages can result in significant savings by reducing losses due to damaged wafers, and preventing equipment damage and downtime. Furthermore, the present invention is cost effective, can be retrofitted on existing processing apparatus 35, and is easy to install.

The present invention has been described in considerable detail with reference to certain preferred versions thereof. However, other versions are possible. For example, the present invention can be used with alternative emitters or sensors, such as radiowave systems, or to detect proper positioning of other processing components, and is not limited to processing of semiconductor substrates 70. Therefore the spirit and scope of the appended claims should not be limited to the description of the preferred versions contained herein.

What is claimed is:

1. A position sensor for detecting proper placement of a substrate holder in a chamber, said position sensor comprising:
   (a) an optical emitter for emitting a light beam;
   (b) an optical sensor for sensing said light beam emitted by said optical emitter; and
   (c) a light regulator comprising a movable member having an aperture, said movable member actuated to move between a blocking position where said aperture is substantially nonaligned with said light beam from said optical emitter when said substrate holder is improperly positioned in said chamber and a transmitting position where said aperture is aligned with said light beam allowing said light beam to reach said optical sensor when said substrate holder is properly positioned in said chamber.

2. The position sensor of claim 1 wherein said movable member comprises rotatable means coupled to a receiving surface of said chamber, said rotatable means provided for rotating said aperture from said blocking position to said transmitting position.

3. The position sensor of claim 2 wherein said rotatable means comprises an actuator in a channel of said receiving surface of said chamber, said channel sized to hold an alignment guide of said substrate holder,
   wherein proper placement of said substrate holder on said receiving surface causes said alignment guide of said substrate holder to activate said actuator causing said aperture to rotate.

4. The position sensor of claim 1 wherein said optical emitter directs said light beam substantially adjacent to substrates in said substrate holder so that displacement of a substrate a predetermined distance out of said substrate holder, causes an edge of said substrate to block the light beam from said optical sensor.

5. The position sensor of claim 4 wherein said predetermined distance is at least about 0.25 inches.

6. The position sensor of claim 1 further comprising a placement indicator responsive to said optical sensor for indicating proper placement of said substrate holder.

7. The position sensor of claim 6 wherein said placement indicator comprises an on-mode and an off-mode, and wherein said placement indicator is in said on-mode when said optical sensor senses said beam of light, and is in said off-mode when said optical sensor does not sense said beam of light.

8. A position sensor for detecting proper placement of a substrate holder in a chamber, said position sensor comprising:
   (a) an optical emitter for emitting a light beam;
   (b) an optical sensor for sensing said light beam emitted by said optical emitter; and
   (c) a light regulator comprising a movable member having a reflector, said movable member actuated to move between a blocking position where said reflector reflects said light beam away from said optical sensor when said substrate holder is improperly positioned in said chamber and a transmitting position where said reflector reflects said light beam toward said optical sensor when said substrate holder is properly positioned in said chamber.

9. The position sensor of claim 8 wherein said movable member comprises rotatable means coupled to a receiving surface of said chamber, said rotatable means provided for rotating said reflector from said blocking position to said transmitting position.

10. The position sensor of claim 9 wherein said rotable means comprises an actuator in a channel of said receiving surface of said chamber, said channel sized to hold an alignment guide of said substrate holder,
    wherein proper placement of said substrate holder on said receiving surface causes said alignment guide of said substrate holder to activate said actuator causing said reflector to rotate.

11. The position sensor of claim 8 wherein said optical emitter directs said light beam substantially adjacent to substrates in said substrate holder so that displacement of a substrate a predetermined distance out of said substrate holder, causes an edge of said substrate to block the light beam from said optical sensor.

12. The position sensor of claim 8 further comprising a placement indicator responsive to said optical sensor for indicating proper placement of said substrate holder.

13. A position sensor for detecting proper placement of a substrate holder on a receiving surface in a chamber, said position sensor comprising:
    (a) an optical emitter for emitting a light beam;
    (b) an optical sensor for sensing said light beam emitted by said optical emitter; and
    (c) a light regulator comprising a movable member having rotatable means coupled to said receiving surface, said rotatable means capable of rotating said movable member between a blocking position that blocks said light beam from said optical sensor when said substrate holder is improperly positioned in said chamber and a transmitting position that allows said light beam to reach said optical sensor when said substrate holder is properly positioned in said chamber.

14. The position sensor of claim 13 wherein said rotatable means comprises an actuator in a channel of a receiving surface of said chamber, said channel sized to hold an alignment guide of said substrate holder,
    wherein proper placement of said substrate holder on said receiving surface causes said alignment guide of said substrate holder to activate said actuator causing said movable member to rotate.

15. The position sensor of claim 13 wherein said optical emitter directs said light beam substantially adjacent to substrates in said substrate holder so that displacement of a substrate a predetermined distance out of said substrate holder, causes an edge of said substrate to block the light beam from said optical sensor.

16. The position sensor of claim 13 further comprising a placement indicator responsive to said optical sensor for indicating proper placement of said substrate holder.

17. A position sensor for detecting proper placement of a substrate holder on a receiving surface in a chamber, said position sensor comprising:

(a) aligning means for aligning said substrate holder in said chamber, said aligning means comprising a channel in said receiving surface in said chamber, said channel sized to hold an alignment guide of said substrate holder;

(b) detecting means for detecting alignment of said substrate holder by said aligning means, said detecting means comprising (i) an optical source for generating a light beam, (ii) an optical sensor and (iii) a light regulator controlled to move between a blocking position when said substrate holder is improperly placed in said chamber and a transmitting position when said substrate holder is properly placed in said chamber; and (c) indicator means responsive to said detecting means for indicating proper placement of said substrate holder.

18. The position sensor of claim 17 wherein said light regulator comprises a movable member with an aperture therein, said movable member having (i) a blocking position in which said aperture is substantially nonaligned with said light beam, and (ii) a transmitting position in which said aperture is substantially aligned with said light beam allowing said light beam to reach said optical sensor.

19. The position sensor of claim 17 wherein said light regulator comprises a movable member having a reflector, said movable member having (i) a blocking position in which said light beam is reflected away from said optical sensor, and (ii) a transmitting position in which said reflector reflects said light beam toward said optical sensor.

20. The position sensor of claim 17 further comprising means for detecting displacement of a substrate in said substrate holder.

21. The position sensor of claim 20, wherein said means for detecting displacement of a substrate comprises an optical emitter positioned to direct said light beam substantially adjacent to said substrates in said substrate holder so that displacement of said substrate a predetermined distance out of said substrate holder causes an edge of said substrate to block said light beam from an optical sensor.

22. A position sensor for ensuring proper placement of a substrate holder on a receiving surface in a chamber, said receiving surface configured to align said substrate holder in said chamber, said position sensor comprising:

(a) an optical emitter for emitting a light beam;

(b) an optical sensor for detecting said light beam;

(c) a light regulator capable of blocking said light beam from said optical sensor; and (d) an actuator for actuating said light regulator, said actuator coupled to said receiving surface of said chamber, and said actuator provided for moving said light regulator between (i) blocking positions that block said light beam when said substrate holder is improperly positioned in said chamber, and (ii) transmitting positions that transmit said light beam to said optical sensor when said substrate holder is properly positioned in said chamber.

23. The position sensor of claim 22 wherein said light regulator comprises a movable member having an aperture therein, and wherein (i) in said blocking position said actuator moves said movable member so that said aperture is substantially nonaligned with said light beam, and (ii) in said transmitting position said actuator moves said movable member so that said aperture is aligned with said light beam allowing said light beam to reach said optical sensor.

24. The position sensor of claim 22 wherein said light regulator comprises a movable reflector, and wherein (i) in said blocking position, said actuator moves said reflector to reflect said light beam away from said optical sensor, and (ii) in the transmitting position, said actuator moves said reflector to reflect said light beam toward said optical sensor.

25. The position sensor of claim 22 wherein said actuator comprises rotatable means coupled to said receiving surface in said chamber, said receiving surface comprising a channel sized to hold an alignment guide of said substrate holder, and wherein proper placement of said substrate holder on said receiving surface causes said alignment guide of said substrate holder to rotate said rotatable means to the transmitting position.

26. The position sensor of claim 22 wherein said optical emitter is positioned to direct said light beam substantially adjacent to said substrates in said substrate holder so that displacement of a substrate a predetermined distance out of said substrate holder, causes an edge of said substrate to block the light beam from said optical sensor.

27. The position sensor of claim 22 further comprising a placement indicator responsive to said optical sensor for indicating proper placement of said substrate holder.

28. The position sensor of claim 26 wherein said optical emitter is mounted in said chamber so that said light beam is directed substantially perpendicular to the peripheral edge of said substrates.

29. The position sensor of claim 26 wherein said optical emitter is positioned so the displacement of said edge of said substrate by a predetermined distance of at least about 0.25 inches out of said substrate holder blocks said light beam from said optical sensor.

30. The position sensor of claim 26 wherein said placement indicator comprises an on-mode and an off-mode, said placement indicator being in said on-mode when said optical sensor senses said beam of light, and in said off-mode when said optical sensor does not sense said beam of light.

31. The position sensor of claim 26 wherein said optical emitter is mounted in said chamber so that said light beam is directed substantially perpendicular to the peripheral edge of said substrates.

32. A method for using an optical system including (i) an optical emitter for emitting a light beam, (ii) an optical sensor for sensing said light beam emitted by said optical emitter, and (iii) a light regulator comprising an aperture or reflector in the path of said light beam, said light regulator actuated to move between a light blocking position and a light transmitting position, thereby detecting proper placement of a substrate holder on a receiving surface in a chamber, the method comprising the steps of placing said substrate holder on said receiving surface of said chamber to activate said light regulator to move between said light blocking position and the light transmitting position.

33. The method of claim 32 further comprising the step of detecting displacement of a substrate in said substrate holder.

34. The method of claim 32 comprising the step of directing said light beam substantially adjacent to said substrates in said substrate holder so that displacement of said substrate in said substrate holder a predetermined distance out of said substrate holder, causes an edge of said substrate to block said light beam from said optical sensor.

35. An apparatus for detecting proper placement of a substrate holder in a chamber, said apparatus comprising:

(a) an optical emitter capable of emitting a light beam;

(b) an optical sensor capable of sensing said light beam;

(c) a light regulator having an aperture or reflector in the path of said light beam, said light regulator capable of moving between a light blocking position and a light transmitting position, to detect proper placement of a substrate holder on a receiving surface in a chamber; and (d) an alignment and actuating means comprising an alignment guide for aligning said substrate holder in said chamber and for moving said light regulator.

36. The position sensor of claim 35, wherein said optical emitter is positioned to direct said light beam substantially adjacent to said substrates in said substrate holder so that displacement of an edge of a substrate in said substrate holder, causes said substrate edge to block said light beam from said optical sensor.

* * * * *